(12) United States Patent
Ward

(10) Patent No.: US 7,788,646 B2
(45) Date of Patent: Aug. 31, 2010

(54) METHOD FOR OPTIMIZING INTEGRATED CIRCUIT DEVICE DESIGN AND SERVICE

(75) Inventor: David Ward, Broomfield, CO (US)

(73) Assignee: International Business Machines Corporation, Armonk, NY (US)

( * ) Notice: Subject to any disclaimer, the term of this patent is extended or adjusted under 35 U.S.C. 154(b) by 1356 days.

(21) Appl. No.: 11/250,969

(22) Filed: Oct. 14, 2005

(65) Prior Publication Data

US 2007/0089075 A1 Apr. 19, 2007

(51) Int. Cl.
*G06F 9/44* (2006.01)
*G06F 17/50* (2006.01)

(52) U.S. Cl. .................. 717/132; 717/124; 717/131; 716/4

(58) Field of Classification Search ............ 717/124, 717/132, 133
See application file for complete search history.

(56) References Cited

U.S. PATENT DOCUMENTS

| | | | |
|---|---|---|---|
| 6,381,738 B1* | 4/2002 | Choi et al. ........... | 717/140 |
| 6,484,134 B1 | 11/2002 | Hoskote | |
| 6,643,827 B1 | 11/2003 | Yang | |
| 6,975,976 B1* | 12/2005 | Casavant et al. ...... | 703/14 |
| 7,058,910 B2 | 6/2006 | Bharadwaj et al. | |
| 7,246,331 B2* | 7/2007 | Ward .................. | 716/4 |
| 7,281,225 B2* | 10/2007 | Jain et al. ............ | 716/5 |
| 7,308,657 B2* | 12/2007 | Ward .................. | 716/4 |
| 2004/0017769 A1* | 1/2004 | Denecheau et al. .... | 370/218 |

OTHER PUBLICATIONS

Ravi et al. (Hints to accelerate Symbolic Traversal, 1999, Proceedings of the 10th IFIP WG 10.5 Advanced Research Working Conference on Correct Hardware Design and Verification Methods).*
Bloem et al. (Symbolic guided search for CTL model checking, 2000, Proceedings of the 37th Annual Design Automation Conference).*
Bloem et al. (Efficient Decision Procedures for Model Checking of Linear Time Logic Properties, 1999, Proceedings of the 11th International Conference on Computer Aided Verification).*
Yalagandula et al. (Automatic lighthouse generation for directed state space search, 2000, Proceedings of the conference on Design, automation and test in Europe).*
Bloem et al. (Approximations for fixpoint computations in symbolic model, 2000, Proceedings of the World Multiconference on Systemics, Cybernetics and Informatics).*
Ward et al. (Automatic Generation of Hints for Symbolic Traversal, Proc. CHARME, pp. 207-221 , 2005).*

\* cited by examiner

*Primary Examiner*—Lewis A Bullock, Jr.
*Assistant Examiner*—Hang Pan
(74) *Attorney, Agent, or Firm*—David W. Victor; Konrad Raynes & Victor LLP

(57) ABSTRACT

Improved analysis and refinement of integrated circuit device design and other programs is facilitated by methods in reach-ability analysis is performed using hints which define a particular path through a program. To ensure that a reasonable number of states are reached during reach-ability analysis a order to apply the hints is determined. The ordering prioritizes hints which define program paths which set a given variable over hints which define program slice which use the given variable.

12 Claims, 9 Drawing Sheets

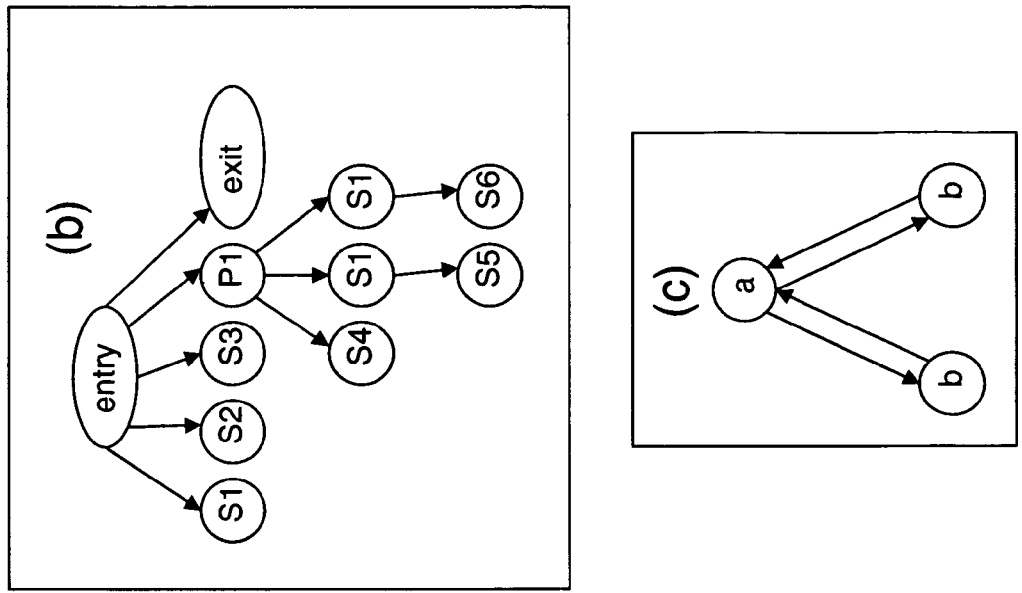
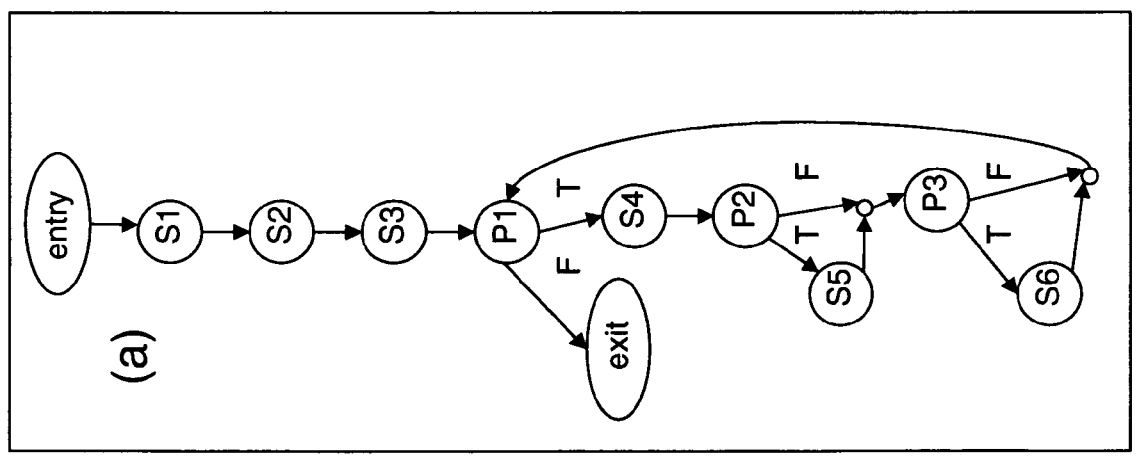
Fig. 2

300

P1: If (test1)
S2:    b = c
S3: else a = a + 2
P4: if (test2)
S5:    d = c
S6: else c = c + 1

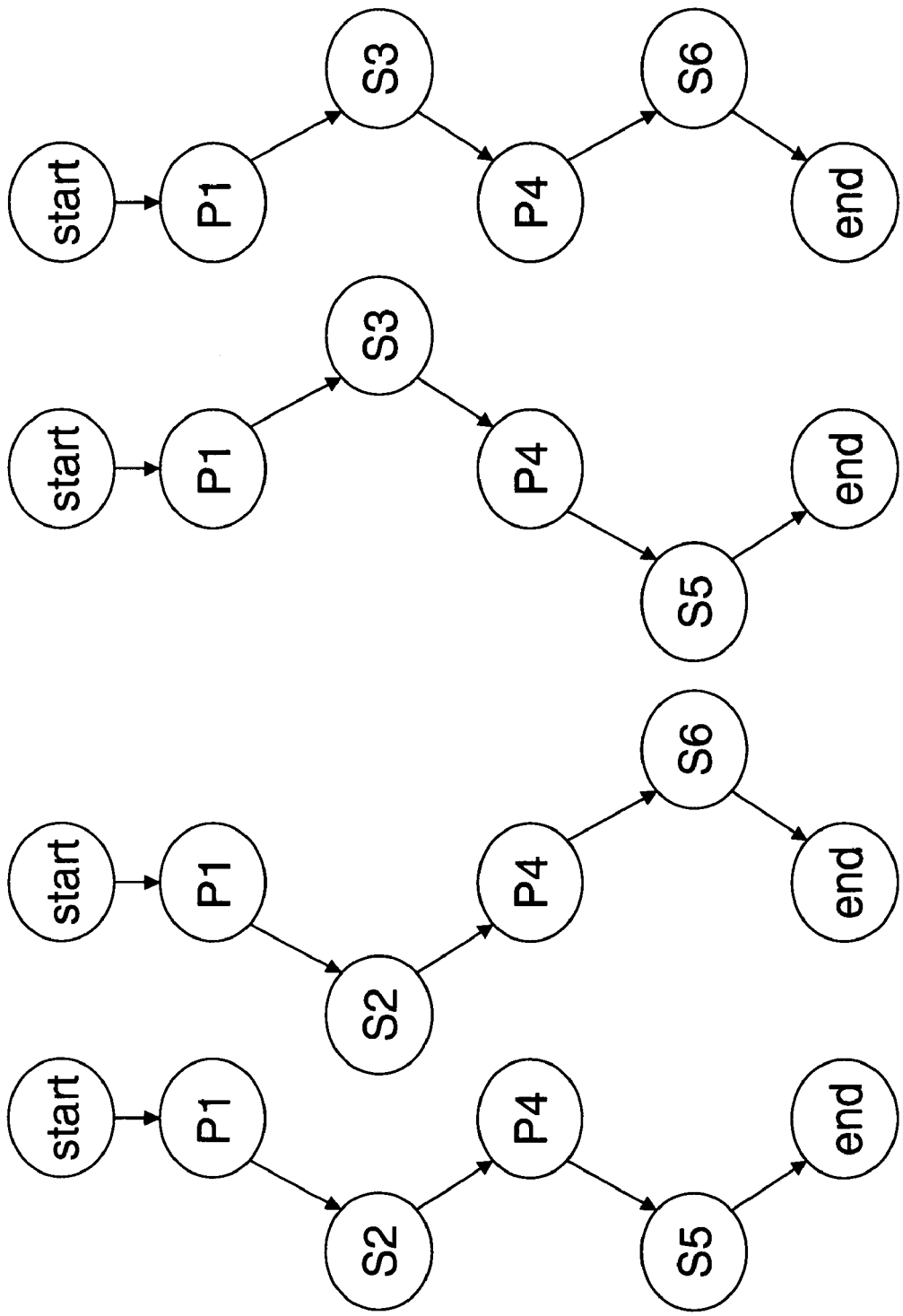

Fig. 6a

|       | S2+S5 | S2+S6 | S3+S5 | S3+S6 |
|-------|-------|-------|-------|-------|
| test1 | true  | true  | false | false |
| test2 | true  | false | true  | false |

Fig. 6b

| initial | (0,0,0,0) |
|---------|-----------|
| S2 + S5 | -         |
| S2 + S6 | (0,0,1,0), (0,1,2,0), (0,2,3,0) |
| S3 + S5 | (2,0,1,1), (2,1,2,2), (2,2,3,3) |
| S3 + S6 | (2,0,1,0), (2,0,2,0), (2,2,3,0) |

Fig. 10a

| initial | (0,0,0,0) |
|---|---|
| S3 + S6 | (2,0,1,0) |
| S2 + S6 | (0,0,1,0), (0,1,2,0), (0,2,3,0), (2,1,2,0), (2,2,3,0) |
| S3 + S5 | (2,0,0,0), (2,0,1,1),(2,1,2,2), (2,2,3,3) |
| S2 + S5 | (2,1,1,1), (0,1,1,1), (0,2,2,2), (0,3,3,3), (2,2,2,2), (2,3,3,3) |

Fig. 10b

| initial | (0,0,0,0) |
|---|---|
| S3 + S6 | (2,0,1,0) |
| S2 + S6 | (0,0,1,0), (0,1,2,0), (0,2,3,0), (2,1,2,0), (2,2,3,0) |
| S3 + S5 | (2,1,1,1), (0,1,1,1), (0,2,2,2), (0,3,3,3), (2,2,2,2), (2,3,3,3) |
| S2 + S5 | (2,0,0,0), (2,0,1,1),(2,1,2,2), (2,2,3,3) |

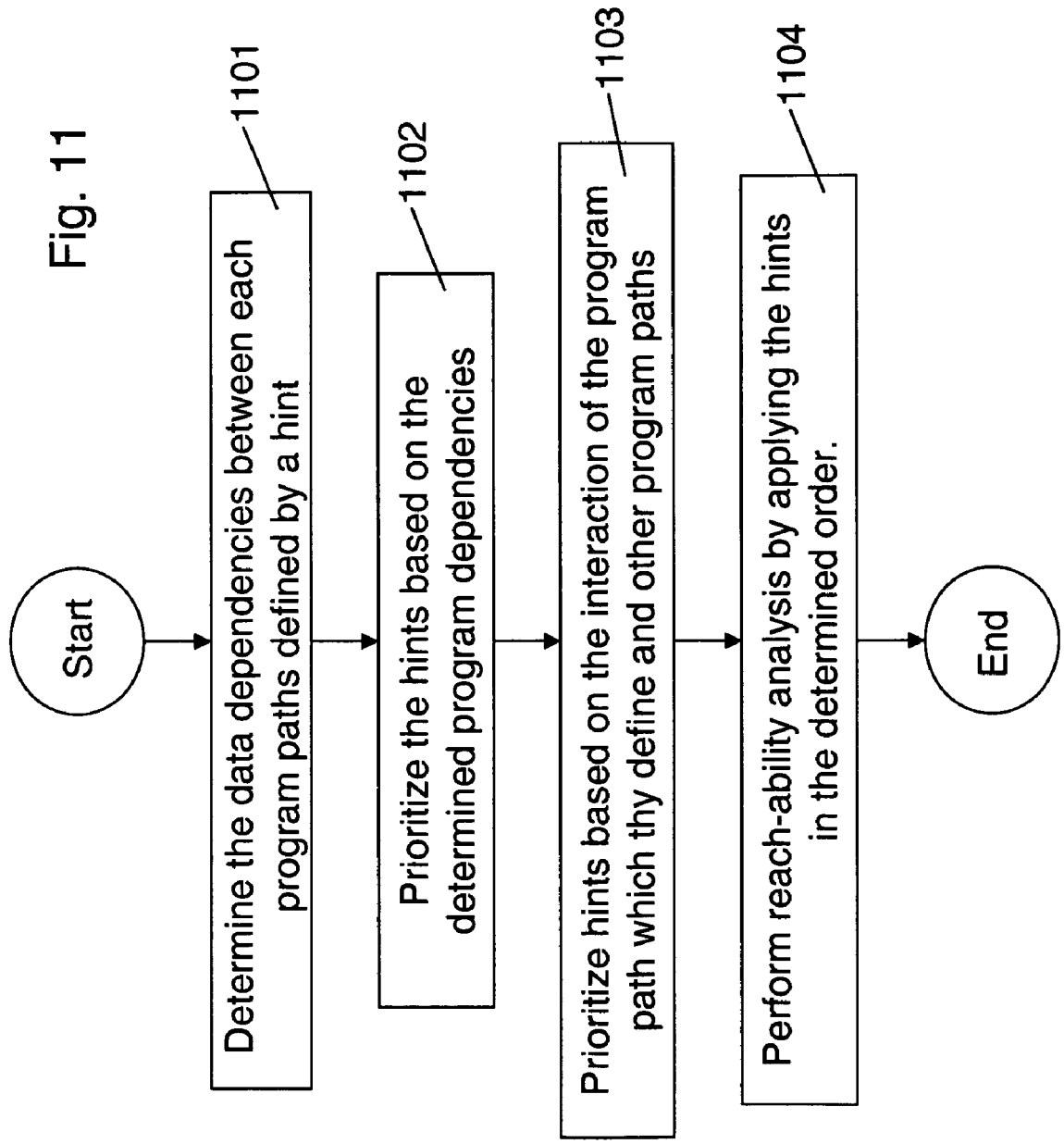

METHOD FOR OPTIMIZING INTEGRATED CIRCUIT DEVICE DESIGN AND SERVICE

FIELD AND BACKGROUND OF INVENTION

This invention relates to program analysis techniques, and in particular use of hints when performing program analysis, for example, a program which relates to an integrated circuit design.

The design of integrated circuit devices conventionally uses hardware description languages (HDLs) to describe circuits (herein also sometimes called "systems") at various levels of abstraction. As a circuit design evolves, designers and verification engineers (whose job it is to assure that the design functions appropriately) conduct analysis of the device being designed to evaluate the quality of the design and to hopefully find and eliminate any inadequacies potentially leading to future problems such as impossibility or inaccuracy in performance of the device.

One problem encountered in such analysis is referred to as a "state explosion", which occurs when an input to the design, intended to permit analysis of the response of the device to a particular input, generates such a large number of possible output or intermediate states as to overrun any memory used in supporting the analysis.

Reachability analysis plays a central role in formal verification of sequential circuits. One of the state-of-the-art approaches for reachability analysis and formal verification of circuits modeled as Finite State Machines (FSMs) exploits symbolic computations based on Binary Decision Diagrams (BDDs). However, the known state explosion problem may cause large intermediate BDD sizes during the exploration of the state space of a system. The conventional breadth-first search (BFS) strategy, used in most implicit model checking algorithms, is the main culprit. Others have approached this problem by devising techniques that simplify the system model employed during BFS.

Some recent work in avoiding the state explosion problem during one known analysis procedure, breadth-first symbolic traversal based on Binary Decision Diagrams (BDDs), applies hints to constrain the transition relation of the system to be verified. Hints are expressed as constraints on the primary inputs and states of a circuit modeled as a Finite State Machine (FSM) and can often be found with the help of simple heuristics by someone who understands the circuit well enough to devise simulation stimuli or verification properties for it. However, the ease of finding good hints is limited by the size and complexity of the design, and extending their applicability to larger designs is a key issue.

In one such proposal, "hints" are used to guide the exploration of the state space. In that proposal, hints are classified into those that depend on the invariants being checked (proving properties that should hold in all reachable states of a system) and those that capture knowledge of the design. Hints are applied by constraining the transition relation of the system; the constrained traversal of the state space proceeds much faster than the unconstrained system (original transition relation). This method obtained orders-of-magnitude reductions in time and space requirements during the exploration of the state space. Hints can often be found by someone who understands the design well enough to devise simulation stimuli or verification properties for it. However, in large complex designs, identifying good hints can be a labor-intensive process requiring many attempts, and in most cases does not avoid the state space explosion problem. Acceptance of this method by designers and verification engineers will certainly benefit from a more efficient technique to devise good hints from a system being verified.

SUMMARY OF THE INVENTION

A problem associated with using hints to perform reachability analysis of a program is that the order in which the hints are applied will have an affect on the number of states reached and as a result a method is required which may be used to automatically identify a reasonable order in which to apply hints.

Accordingly, according to a first aspect the present provides a method comprising: obtaining a set of hints for use in performing reachability analysis of a program, each hint defining a particular computational path of the program; and determining an order to apply the hints when performing reach-ability analysis comprising: determining that a variable which is set in a program path defined by a first hint is used in a program path defined by a second hint; and prioritizing the first hint over the second hint.

According to a second aspect the present invention provides a data processing system comprising: at least one processor; and memory accessible to the at least one processor and comprising a file system; the at least one processor for performing sub-processes of: obtaining a set of hints for use in performing reachability analysis of a program, each hint defining a particular computational path of the program; and determining an order to apply the hints when performing reach-ability analysis comprising: determining that a variable which is set in a program path defined by a first hint is used in a program path defined by a second hint; and prioritizing the first hint over the second hint.

According to a third aspect the present invention provides a computer program product comprising a computer useable medium having a computer readable program, wherein the computer readable program when executed on a computer causes the computer perform the steps of: obtaining a set of hints for use in performing reachability analysis of a program, each hint defining a particular computational path of the program; and determining an order to apply the hints when performing reach-ability analysis comprising: determining that a variable which is set in a program path defined by a first hint is used in a program path defined by a second hint; and prioritizing the first hint over the second hint.

Preferably determining an order to apply the hints further comprises determining that a variable which is set in the program path defined by the second hint is used in a program path defined by a third hint; and prioritizing the second hint ahead of the third hint.

Optionally determining an order to apply the hints is used to determine a plurality of first and second hints.

Optionally determining an order to apply the hints further comprises determining a plurality of hints which have an equal priority; and prioritizing the determined plurality hints based on the interaction of the program paths which each hint defines with a designated program path.

Optionally the validation of a determination that a variable which is set in the program path defined by a one hint is used in a program path defined by another hint, wherein the variable is set in a first statement and used in a second statement, is checked by: associating the setting of a token variable to a first predetermined value with the first statement; associating with any statements between the first and second statements which modify the value of the variable, the setting of the token to a second predetermined value; and determining that the data dependency does not exist if the second statement is not reachable with the token set to the first predetermined value.

Optionally wherein checking the validity of a determination that a variable which is set in the program path defined by a one hint is used in a program path defined by another hint further comprises: setting a second token to the second predetermined value; and associating with the second statement, the setting of the second token to the value of the first token; and wherein determining that the data dependency does not exist comprises using the second token to obtain the value of the first token when the subsequent statement is reached.

BRIEF DESCRIPTION OF DRAWINGS

Some of the purposes of the invention having been stated, others will appear as the description proceeds, when taken in connection with the accompanying drawings, in which:

FIG. 2 is a illustrative representation of BDDs;

FIGS. 5a, 5b, 5c, 5d is a representation of a set of subgraphs generated from the control flow graph of FIG. 4;

FIG. 6a is a table of possible hints for performing reach-ability analysis of the sample program of FIG. 3;

FIG. 6b is a table of states reached when applying the hints of FIG. 6a in order to perform reach-ability analysis of the sample program of FIG. 3;

FIGS. 10a and 10b are tables of the states reached when applying the hints of FIG. 6a in an order determined from the SCC quotient graph of FIG. 9 to perform reachability analysis of the sample program of FIG. 3; and FIG. 11 is a flow diagram of a method for determining an order to apply hints when performing reach-ability analysis of a program.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention. In particular, while the context for this disclosure is the design of integrated circuit devices, it is known that the "state explosion" problem here addressed is also found in software design and believed that the techniques and method here described will find usefulness in such applications.

Figure 1:
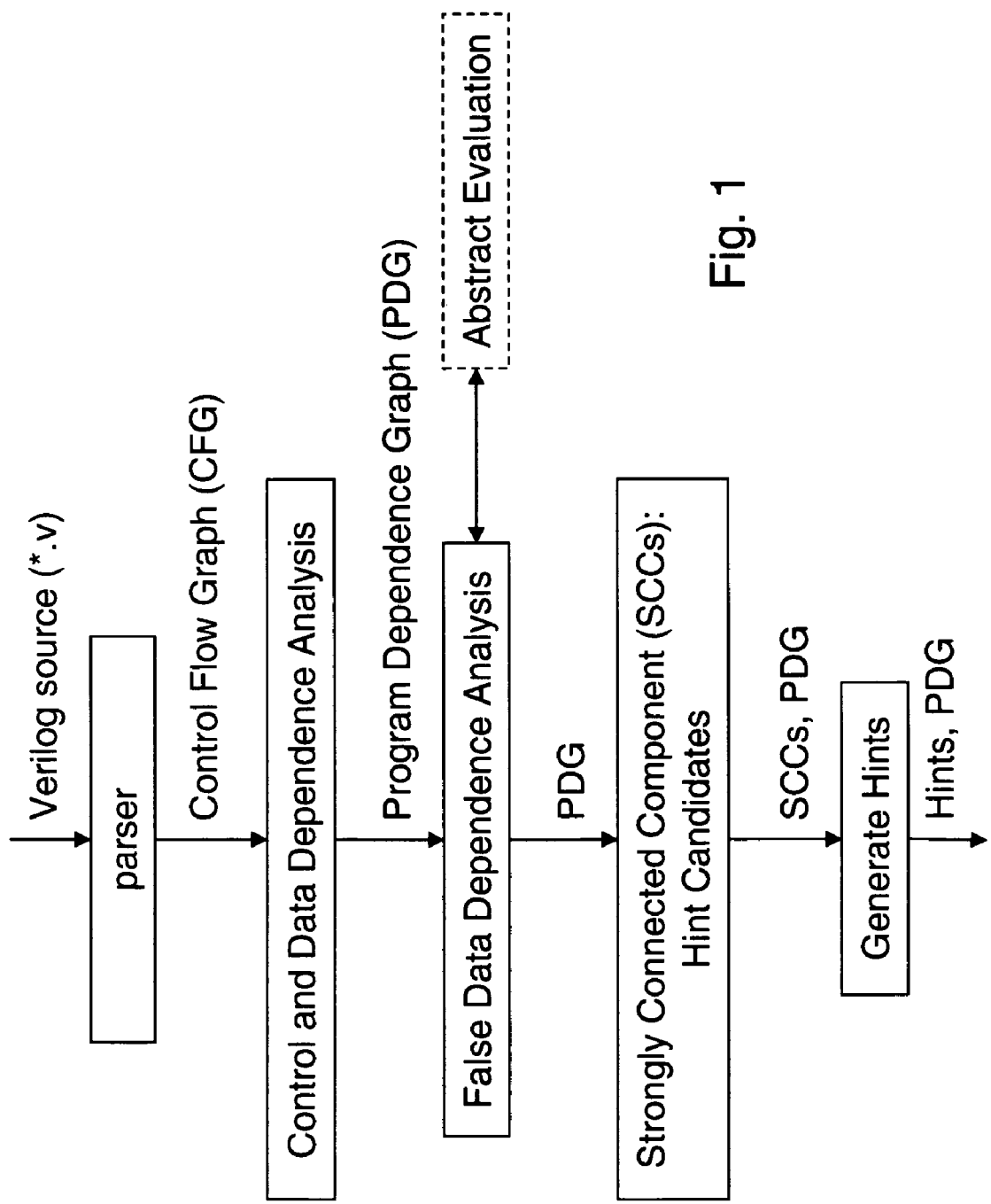
FIG. 1 is a schematic illustration of the steps of a method in accordance with this invention.

The program analysis techniques employed to accomplish the objective outlined above are program parsing or slicing to abstract subprograms from the original program text, and abstract interpretation to obtain the over-approximate reachable states and relevant properties for each subprogram. Additionally, the program dependence graph (PDG) is the intermediate form of choice for its rich set of supporting algorithms and efficient representation of control and data dependencies of program operations. The steps of such a method are illustrated in FIG. 1.

Analysis done on programs using this technique is achieved at a higher level of abstraction (program text) thus circumventing the time-space complexity issues that plague BDD-based formal verification methods. This has been validated using a subset of Verilog (behavioral Verilog), however, it is not restricted to this class of languages. It can be easily extended to any simple imperative language.

Hardware description languages (HDLs) like Verilog and VHDL, are used by hardware developers to describe circuits at various levels of abstraction (e.g., RTL, behavioral). HDL programs are translated into Finite State Machines (FSMs) to do reachability analysis. While the technique here described has been validated using behavioral Verilog, it will here be explained using the much simpler imperative While language of Nielson et al, *Principles of Program Analysis*, Springer-Verlag, Berlin, 1999. The syntax of the While language is represented below. A single entry and exit element are assumed for each well-formed program.

---

AEXP := n | var | a1 + a2 | a1 − a2
BEXP := true | false | a1 = a2 | a1 < a2 | a1 ≦ a2 | a1 > a2 | a1 ≧ a2 |
  ¬ b | b1 ∧ b2
S    ::= var:= a | S$_1$ ; S$_2$ | read x
if b then S$_1$ else S$_2$ | b do S | skip

---

What is here used is a structural operational semantics for While as defined in the Neilson citation above. The meaning of a program P is defined as the final state, where state σ is a mapping from variables to values (integers), that can be reached after a number of transitions. Each transition has the form (S, σ)→ρ where ρ is either an intermediate state (S', σ') or the final state σ'. The rules for the transition are as follows:

1. The var:=a rule updates the state with the value of the right-hand side.
2. The if . . . rule selects the true or false alternative, depending on the value of the condition without changing the value of state (S$_1$, σ) if true, or (S$_2$, σ) otherwise.
3. The while . . . rule repeats the statement S until the condition b is false, when it terminates with a skip statement ((if b then (S; while b do S) else skip, σ))
4. The S$_1$; S$_2$ sequence rules: one, when the first statement S$_1$ in a sequence goes to an intermediate statement and state (S$_1$'; S$_2$, σ'(which is the case for the if . . . , while . . . , S$_1$; S$_2$); two, when the first statement terminates immediately (S$_2$, σ') (which is the case for the var:=a and skip).
5. The skip rule does nothing—no change to state.

Given a set of hints τ$_1$, τ$_2$, . . . τ$_k$ (where each τ is a transition relation obtained by constraining the inputs or state variables of the model) the computation of the reachable states can be decomposed into the computation of a sequence of fix points—one for each hint. If hints are chosen properly, the computation of least fix points can be substantially sped up. If small transition systems result for each τ, reachability analysis may proceed further compared to computing the model fix point directly, and in some cases go to completion by avoiding the memory explosion problem. Intuitively, it is easy to reason about the benefits afforded to invariant checking from these results.

Given a sequence of monotonic functionals $\tau_1, \tau_2, \ldots \tau_k$ such that $\tau_1 \leq \tau_k$ for $0 < i < k$, the sequence $\rho_1, \rho_2, \ldots, \rho_k$ of least fix points defined by $$\rho_0 = 0$$

$$\rho_i = \mu X. \rho_{i-1} V \tau_i(X), \ 0 < i \leq k$$

monotonically converges to $\rho = \mu X. \tau_k(X)$; that is, $\rho_0 \leq \rho_1 \ldots \leq \rho_k = \rho$ The traditional BFS reachability analysis algorithm can be modified to take advantage of hints: first, each hint, in order, is used to constrain the original transition relation, the algorithm is allowed to run normally until all reachable states are reached. The frontier set for each run is either the initial states, for the first hint, or the reached states from the previous run; finally, the original transition relation is restored and runs to completion or is terminated early due to time-space exhaustion. Its frontier set is the set of reachable states produced by the last hint.

Many program analysis techniques work on graphs derived from the program text. Among these, the Control Flow Graph (CFG) is a directed graph that represents the flow of control of a program. Each node represents an assignment or branching statement $S_i$ in a program P. Each directed arc represents flow of control from one node to another. A CFG can be extracted in a single pass traversal over a program. A CFG would be constructed for each Verilog "always" block or each "procedure" in a imperative language. The CFG is the primary data structure and there exist a plethora of efficient algorithms to do graph-based operations (e.g., searches). Preparation of a CFG as a step in the methods of this invention is indicated in FIG. 1.

A control flow graph CFG of a program P with statements S is a directed graph G=(V, E), where:
  V=S∪{exit,entry,junction} is a finite set of nodes, where {entry, exit, junction} are distinguished entry, exit, and junction nodes, respectively, and
  E ⊂ V×V is a control flow relation, whose elements are directed edges.

Intuitively, edges are constructed in the normal way from statement $S_1$ to $S_2$ by tracing the sequential execution flow of a program. Generally, edges E represent the transfer of control between statements S.

A path p in a CFG is a sequence of nodes $v_1, v_2, \ldots v_n$ such that $n \geq 0$ and $(v_i, v_{i+1}) \in E$ for $i = 1, 2, \ldots, n-1$.

Control dependence represents the effect of conditional branch statements on the behavior of programs. Given any two statements $S_1$ and $S_2$ in P, statement $S_2$ is control-dependent on $S_1$ if $S_1$ is a conditional branch statement and the control structure of P potentially allows $S_1$ to decide whether $S_2$ will be executed. Control dependence can be defined strictly in terms of a CFG.

$S_1$ is post dominated by $S_2$ in a CFG if all paths from $S_1$ to exit include $S_2$.

$S_2$ is control dependent on $S_1$ if and only if:
  1. There exists a path p from $S_1$ to $S_2$ and the path is non-null, such that $S_2$ post dominates every node along the path, and
  2. $S_1$ is not post dominated by $S_2$.

If $S_2$ is control dependent on $S_1$ in a CFG, then $S_1$ must have two outgoing edges. Following one of the edges always leads to $S_2$, and using the other edge there is a path to exit that bypasses $S_2$. A control dependent edge can be added to the CFG to show the dependence relation. The resulting CFG augmented with the control dependence information is referred to as $G_{cd} = (V, E \cup E_{cd})$, where $E_{cd}$ is the set of control dependence edges. Control dependence is an important concept for it is needed to explain the meaning of a static program slice. A control and data dependence analysis is indicated in FIG. 1 between the generation of a CFG and the generation of a PDG.

Attention now turns to a discussion of different types of dependence between statements S in a CFG. Given any two statements $S_1$ and $S_2$, one or more of the following data dependence relations may hold between them:

data dependence representing an assignment of a variable followed by a read access (use) of the same variable (without any intervening assignment of the same variable);

output dependence representing an assignment to a variable by another assignment to the same variable; and antidependence representing a read access (use) of a variable followed by an assignment of the same variable. Only data dependencies between statements are considered in this discussion. $OUT(S_i)$ may be the left-hand side variable of $S_i$ and $IN(S_i)$ may be the set of right-hand side variables of $S_i$, such that for any two statements $S_1$ and $S_2$ in a CFG, the data dependence is defined as follows:

$S_2$ is data dependent on $S_1$ if and only if:
  1. $\exists X \in IN(S_2). \ x = OUT(S_1)$; and
  2. the value x in $S_1$ is used to compute the value of the left-hand side of $S_2$.

The resulting CFG augmented with the data dependence information is referred to as $G_{dd} = (V, E \cup E_{dd})$. Data dependence information is used to identify strongly connected components (SCCs) that may exist for a trace of the execution flow of a program.

A Program Dependence Graph (PDG) derived from the program text is a lossless transformation of the original program. It is possible to go back and forth from one to the other. The PDG is used as an intermediate representation. The PDG, which represents significant information regarding the control and data dependencies of a program, can be defined in terms of the CFG; $PDG = (V, E \cup E_{cd} \cup E_{dd})$.

A goal to which the preferred embodiment of the present invention may be applied is to statically (and cheaply) determine pertinent information of a program that would otherwise be ascertained during run-time. More specifically, it is desired to calculate the run-time behavior of a program without having to run it on all input data, and while guaranteeing termination of the analysis. Abstract interpretation provides the necessary framework in which the operational semantics of a program is defined by a transition relation η over a set of program states σ. This framework aims at computing safe approximations of fixed points of continuous functions over complete lattices. From the usual CFG operational semantics, a collecting semantics is derived automatically by attaching to each program point or CFG edge a set of contexts (states) that flow to that point during execution. The collecting semantics summarizes real run-time behavior, whereas abstract semantics is to compute properties for the program points that describe the concrete context sets. The abstract semantics does so by executing the CFG with abstract values that represent context properties.

The hints generated to help symbolic traversal of a model graph should select subsets of transitions that allow reachability analysis to visit sets of states with many elements and compact representations. Since these representations are usually Binary Decision Diagrams (BDD), it may be said simply that an objective is to have many states with small BDDs. When a model has several major modes of operation, for instance it can execute a set of instructions, enabling one mode at the time is often effective in keeping the BDD sizes under control. The approach of this invention to producing hints automatically is based on identifying the different modes of operation from the Control Flow Graph (CFG) of the model, and prioritizing them according to their dependencies and their promise to reduce time and memory requirements. The process can be divided in three major phases (see FIG. 1):

From the program text a CFG is extracted and from it a reduced program dependency graph (PDG);
From the CFG a list of candidate subprograms is compiled; and Using the PDG, candidates are sorted according to their dependencies and usefulness. Hints are generated from the best candidates. These three phases will now be described in more detail.

The program that defines the model to be analyzed is translated into a CFG, which is augmented with data dependency information to produce a PDG. Since the analysis is conservative, some data dependency arcs in the PDG are false, that is, do not correspond to real data dependencies in the program. Since more data dependency arcs result in fewer degrees of freedom for the prioritization of modes of operation, it is desirable to remove as many false arcs as possible, without incurring excessive costs in the process. Each data dependency arc is tested in turn to determine whether the definition at the tail of the arc can actually reach the usage at its head by augmenting the program with token variables that are set to specific values when assignments to the variables of interest occur. The program slice corresponding to the token variable of the usage variable is extracted from the PDG. The check whether the definition can reach the usage is thus translated into the check for an invariant on the token variable of the usage variable.

Specifically, suppose that the dependency of use $S_1:x:=v_1$ from definition $S_2:y:=x$ is investigated. Two token variables $t_1$ and $t_2$ are added to the program by making the following changes.

Assignments $t_1:=0$ and $t_2:=0$ are added to the beginning of the program.
$S_1$ is changed to $x:=v_1; t_1:=1$.
Every other assignment to $x:=v$ is changed to $x:=v; t_1:=0$.
$S_2$ is changed to $y:=x; t_1:=t_2$.
If in the program slice for $t_2$ no state is reachable in which $t_2=1$, then the data dependency arc from $S_1$ to $S_2$ is removed. Note that we are only interested in direct dependencies. For instance, consider $S_1:x:=2$, $S_2:y:=x$, and $S_3:x:=x+1$. If $S_3$ is always executed between $S_1$ and $S_2$, the dependency arc between $S_2$ and $S_1$ is removed. However, the dependencies of $S_3$ on $S_1$, and of $S_2$ on $S_3$ imply, by transitivity, the one of $S_2$ on $S_1$.

Though program parsing or slicing may greatly reduce the cost of checking the $t_2=0$ invariant relative to reachability analysis of the full model, this is not always the case; hence, each model checking run is allotted a short time to complete. If it does not finish, a less accurate, but less expensive test is applied. The augmented program slice is analyzed with abstract interpretation. If also abstract interpretation fails to complete within the allotted time, the arc is (conservatively) retained.

Analysis of data dependencies will now be illustrated using various examples. However, note that whilst these examples use simple program slices, a skilled person will realize that the invention can equally be applied to more complex program slices.

For example, consider a first sample program slice:
S1: x=v1;
S2: if (boolean==true)
S3: x=2*x;
S4: y=x;

For example, if may be required to determine if statement S4 (the user) has a data dependency on statement S1 (the assigner), that is, is the value of x that is used in setting y in statement S4 the value that x is assigned in statement S1.

In order to determine this, the first sample program slice is modified as shown below:
S0: token1=0; token2=0;
S1: x=v1; token1=1;
S2: if (boolean==true)
S3: x=v2; token1=0;
S4: y=x; token2=token1;

In this modified program slice a statement S0 has been added at the start of the program slice to set token1 and token2 to the same pre-determined value of 0. This statement could be considered to be part of initialization of the program. Further statements S1, S3 and S4 have been modified. Statement S1 sets the value of the variable x and is the assigner of the data dependency test. As a result a statement is associated with it which sets the value of token1 to 1. Statement S3 also sets the value of variable x but is not a subject of the data dependency test and as a result a statement is associated with it which sets the value of token1 to 0. Finally statement S4 uses the variable x and is the user of the data dependency test. As a result a statement is associated with it which sets token2 to the value of token1. Accordingly if an analysis of the program was performed for a value of boolean equal to true, it would be discovered that the value of token2, after statement S4, is 0. This indicates that for boolean equal to true there is S4 does not have a data dependency on S1. However, if an analysis of the program was performed for a value of boolean of false, it would be discovered that the value of token2, after statement S4, is 1. This indicates that for boolean equal to false S4 does have a data dependency on S1.

Note with regard this example described with reference the first sample program slice, a skilled person will realize that use of token2 is unnecessary because its value after statement S4 can be obtained from token1. In this case the assignment to it can be removed from statement S0 and S4. Further, a skilled person will realize that statement S0 is unnecessary because the values of token1 and token2 (if it is used) are guaranteed to be modified by the subsequent statements. Further a skilled person will realize that use of the values 0 and 1 for setting token1 and token2 is arbitrary, and in practice any two different pre-determined values could be used.

Consider also an alternative modification of the first sample program slice:
S0: token1=0, token2=0;
S1: x=v1;
S2: if (boolean==true)
S3: x=v2; token1=1;
S4: y=x; token2=token1;

This modification is used to determine whether statement S4 has a data dependency on S3. Accordingly the setting of token1 and token2 to 0 is associated with statement S0, the setting of token1 is associated with S3, and the setting of token2 to the value of token1 is associated with statement S4. Now when an analysis of the program is performed for a value of boolean of true, it would be discovered that the value of token2, after statement S4, is 1. This indicates that for boolean equal to true there is a data dependency from S4 to S3. However, when an analysis of the program is performed for a value of boolean of false, it would be discovered that the value of token2, after statement S4, is 0. This indicates that for boolean equal to false there is no data dependency from S4 to S3.

Note with regard to the alternative modification of the first sample program slice discussed above a skilled person will realize that statement S0 could be deleted and the setting of token1 and token2 (if token2 is used) to 0 could be associated with statement S1. Further a skilled person will realize that this setting of token1 and token2, for a more complex program slice, could be associated with any statement which is guaranteed to be performed before the two statements which are the subject of the data dependency check.

For example, consider a second sample program slice:
S1: if (boolean1==true)
S2: x=v1;
S3: else x=v2;
S4: if (boolean2==true)
S5: y=x;

This program slice can be used to illustrate an example in which use of token2 is useful. For example, if it is required to determine whether S5 has a data dependency on S2, the program slice would be modified as shown below:
S0: token1=0; token2=0;
S1: if (boolean1==true)
S2: x=v1; token1=1;
S3: else x=v2; token1=0;
S4: if (boolean2==true)
S5: y=x; token2=token1;

In this modification statement S0 has been added and statement S2, S3 and S5 modified. Statement S0 is associated with initializing token1 and token2 to 0. Statement S2, being the assigner of the data dependency test, is associated with the setting of token1 to 1. Statement S3, being an alternative assignment of variable x, is associated with the setting of token1 to 0. Finally statement S5, being the user of the data dependency, is associated with a statement which sets token2 to the value of token1.

In the second sample program slice there are four possible combinations of boolean1 and boolean2 for which program analysis can be performed. These combination are shown in the table below with the values of token1 and token2 which each would produce, and an indication as to whether a data dependency from S5 to S2 exists for their particular values.

| boolean1 | boolean2 | token1 | Token2 | S5-S2 Data dependency? |
|---|---|---|---|---|
| true | true | 1 | 1 | yes |
| true | false | 1 | 0 | no |
| false | true | 0 | 0 | no |
| false | false | 0 | 0 | no |

From this table it can be seen that for boolean1 set to true and boolean 2 set to false, the value of token1 cannot be used to discover the existence of a data dependency of S5 on S2. Accordingly the value of token 2 is required in this case to properly discover the data dependency for these values of boolean1 and boolean2.

The example below is a third sample program slice and one for which use of token2 is also useful.
S0: token1=0, token2=0;
S1: x=v1; token1=1;
S2: if (boolean==true)
S3: x=v2; token1=0;
S4: y=x; token2=token1;
S5: x=v1; token1=0;

In this example it is desired to determine if statement S4 has a data dependency on statement S1. In this example a setting of token1 to 1 is associated with statement S1, the assigner of the data dependency test and a setting of token2 to token1 is associated with statement S4, the user of the data dependency test. Further a setting of token1 to 0 is associated with every other setting of variable x, which in this case is statements S3 and S4. Note that, in this example, the association of the setting of token1 to 0 with statement S4 seems unnecessary. However, this is because the program slice is very simple whereas, in practice, a more complex program slice may be the subject of a data dependency test. In such a more complex program slice the execution order of statement may be much more difficult to determine.

In the third sample program slice there are two possible values boolean for which program analysis can be performed. These values are shown in the table below with the values of token1 and token2 which each would produce, and an indication as to whether S4 has a data dependency on S1 for their particular values.

| boolean1 | token1 | token2 | S4-S1 Data dependency? |
|---|---|---|---|
| true | 0 | 0 | No |
| false | 0 | 1 | Yes |

From this table it can be seen that for boolean set to false, the value of token1 cannot be used to discover the existence of a data dependency from S4 to S1. Accordingly the value of token 2 is required in this case to properly discover the data dependency for these values of boolean.

The modified PDG with (some) false data dependencies removed is one of the two inputs to the final step of our procedure that outputs a list of hints. The other input is a list of sub graphs of the CFG, each corresponding to a mode of operation. The sub graphs are identified by a procedure based on the enumeration of the spanning trees of a graph such as that of FIG. 2. The graph obtained from the CFG by removing the back arcs is a polar graph. Since the graph is polar, there is exactly one path in each spanning tree connecting the poles of the graph. All other paths correspond to dead ends. This path is augmented with all the back arcs that connect its nodes to produce a candidate sub graph.

The enumeration of the spanning trees is augmented so as to take into account input dependencies and feasibility of paths. When a candidate sub graph is generated, the path enabling conditions are tested for joint satisfiability.

The CFG of a reasonably complex model may have many feasible spanning trees. Producing one hint from each of them would lead to too many hints, many of which would not contribute enough states to pay for themselves. Therefore, the set of candidates produced by the enumeration procedure is pared down. The selection of the best candidates is heuristic. Two criteria are currently suggested. The first favors those sub graphs with more states reached during abstract interpretation of the corresponding subprograms. The second criterion favors those sub graphs that result in smaller BDDs for the transition relations for the corresponding models. Ideally, a criterion is desired that accounts for both the number of states and the BDD sizes. However, it is difficult to estimate accurately both without going all the way to guided search. The pruning process eliminates all candidates that prove inferior according to at least one heuristic.

The final step of the procedure sorts the list of candidates using the information on data dependencies provided by the PDG. One hint is then produced from each candidate sub graph by extracting its path enabling predicate. The path enabling predicate of a path is the conjunction of the predicates of all choice nodes along the path. The order in which hints are applied may greatly influence their effectiveness. This is particularly the case when there are data dependencies between the variables occurring in different subprograms. Suppose subprograms $P_1$ and $P_2$ are such that variable x is assigned in $P_1$ by an input statement, while in $P_2$ it is assigned a constant value v. Suppose also that x is used in an assignment y:=x in $P_2$, and that that is the only assignment to y. Then, if the hint extracted from $P_2$ is applied before the hint derived from $P_1$, all the states reached after the two hints have been applied have y=v, whereas, if the order of application is reversed, there will be reachable states for each possible value of y.

In general, there will be cyclic dependencies among subprograms. Hence, the procedure is as follows. A Subprogram Dependency Graph (SDG) is formed with one node for each subprogram. Each node of the SDG is the set of nodes in the PDG that make up the corresponding subprogram. An arc connects nodes u and v of the SDG if there exists an arc (a,b) in the PDG such that a∈u and b∈v. The ordering of the candidate subprograms is obtained from the SDG. In particular the strongly connected components (SCCs) of the SDG define a preorder on the subprograms: We say that u_<v if there is a path from u to v in the SDG. The final order≦ is always a refinement of this preorder in the following sense: if u_<v and v not_<u, then u≦v. However, an arbitrary total order that refines the preorder may not work well, if there are just a few large SCCs.

The problem of deriving a total order from the preorder defined by the SDG is decomposed into two sub problems. The first is the one of linearizing the partial order defined by the SCC quotient graph of the SDG. The second is to find total orders for the nodes of each SCC. The total order of the subprograms results from combining the solutions of these two sub problems in the obvious way.

Any topological sort of the nodes of the SCC quotient graph would satisfy the definition of order refinement. However, different orders result in BDDs of different sizes. It is normally advantageous to keep subprograms adjacent in the order if the operate on common variables. Therefore, to sort the SCCs of the SDG a depth-first search from the source nodes of the SCC quotient graph is performed.

The sorting of the nodes of an individual SCC is based on identifying a starting node, and then enumerating the elementary circuits of the SCC. As enumerate elementary circuits are enumerated from the designated start node, nodes are added to the total order as they appear in some elementary circuit. Reliance is placed on the fact that the enumeration algorithm outputs short circuits first. Short circuits are identified with tight interaction, and therefore those nodes that have tighter interaction with the start node are put earlier in the order. The start node is selected based on the ease with which the variables in it can be controlled via primary inputs. To see why this factor plays an important role, consider, for instance, three an assignment x:=y+z, where y depends on other variables, whereas z is read from an external input. During reachability analysis, for any value of x, and any value of z there is value of z such that x=y+z. (Assuming signed integers.) Hence, the dependency on y, while present, is neutralized by the dependency on z.

This technique attempts to efficiently and effectively identify computational paths in a program that contribute most favorably to the speed-up of symbolic traversal while keeping the intermediate BDDs small. The fact that a program can be viewed as separate subprograms, updating each program variable, is used to advantage. Dividing a program into intermingling subprograms is similar to the partitioned transition relation method. This information is helpful, but alone does not lead to significant improvement; the inter-subprogram relationships (variable dependencies) is the culprit. Partitioning the subprograms into the equivalence classes, the cyclic variable data dependencies, produces the best result. Reachability analysis is a least fix point computation over the transition system defined by the original program, so it can easily be concluded that dividing and operating on a programs individual parallel fix points would be superior. In addition, not all subprogram SCCs are equal. When a SCC is found to be dependent on the input variable(s), the SCC saturates faster and produces smaller intermediate BDDs. These SCCs are favored whenever they are found during analysis.

Some of the concepts of ordering hints will now be described further by way of a preferred embodiment using the sample program 300 of FIG. 3. The program 300 is split into sequentially numbered lines which are prefixed with "S" for statements and "P" for predicates (conditional statements). Predicates involve decisions, based on the value of one or more decision variables, which control the flow to the statements. In the program 300 there are two predicate lines/ nodes, P1 and P4.

Note that the program illustrated is not intended to adhere to any particular language syntax or to perform any particular useful function, but is merely a program which can be used to demonstrate the present invention. Accordingly a skilled person will realize that the invention could equally be applied to programs other languages and for performing other functions. Further such a program could be, for example, a programmatic representation of a hardware circuit or system such as an integrated circuit design.

Figure 4:
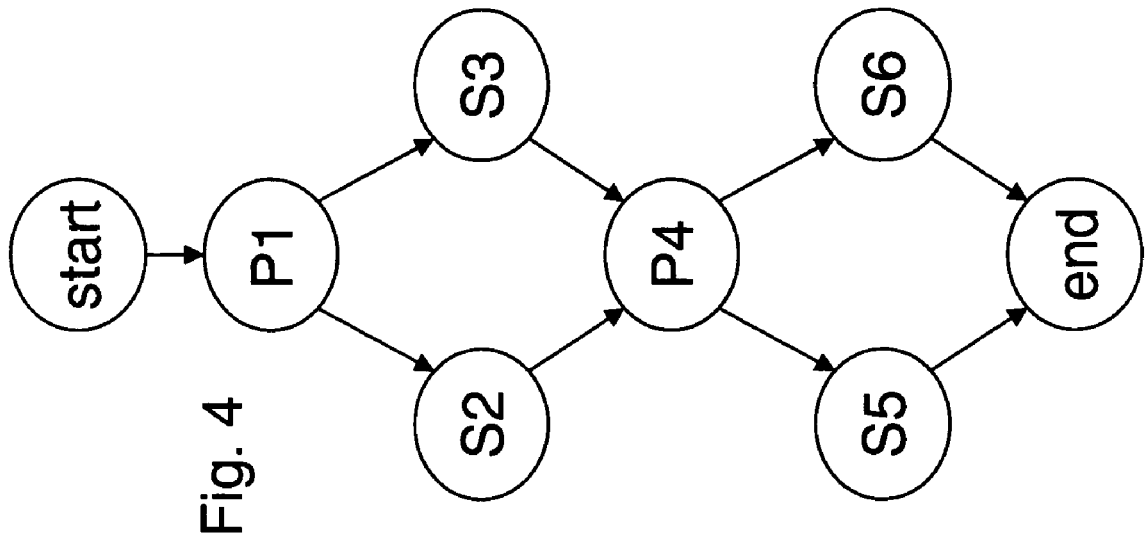
FIG. 4 is a representation of a control flow graph of the sample program of FIG. 3.
Figure 3:
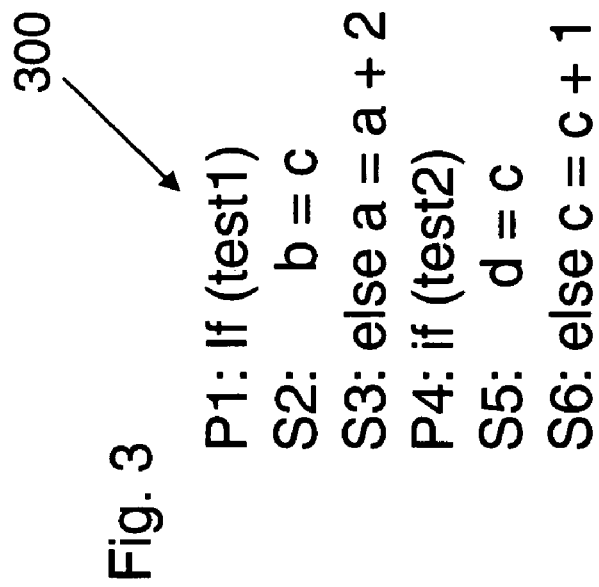
FIG. 3 is a sample program which is used to describe the preferred embodiment of the present invention.

FIG. 4 is a control flow graph of program 300 of FIG. 3 in which each node corresponds to a line from the program. The nodes in the control flow graph are joined by arcs which define the flow through the nodes and correspond to the logic of the program 100. Note that in a control flow graph a node can represent a plurality of statements, for example a single node can represent all of the statements between two conditional statements.

The flow graph is then modified and partitioned in order to leave a set of sub-graphs from which hints are generated. Partitioning is based on internal decision nodes. A variable is an internal decision variable if it does not depend on external inputs. For example, abstract interpretation can be used to identify internal decision variables. A decision node of a control flow graph CFG is an internal decision node if all variables appearing in the predicate attached to the node are internal decision variables. A hint should not constrain internal decision variables, because this may contribute to very few states being reached in reach-ability analysis. Consider, for instance, an internal decision variable that is incremented modulo n at each iteration through the control flow graph. A hint which specifies a value for this variable will allow only one iteration of reach-ability analysis before reaching a fixpoint because as soon as the variable is incremented, all transitions are disabled. In this sense a fixpoint occurs when all states have been reached for a given hint. However, in program 300 of FIG. 3 there are no internal decision variables.

The sub-graphs are obtained by considering a first decision node and creating two sub-graphs, one for each path which follows from the first decision node. This gives a set of two sub-graphs. Next a second decision node is considered, and two sub-graphs are created for each sub-graph in the set, one for each path which follows from the second decision node. This now gives a set of 4 sub-graphs and these steps can be repeated for each decision node in the original control flow graph. Accordingly this produces $2^n$ sub-graphs where n is the number of decision nodes present in the control flow graph and each of the sub-graph represents a computational path through the program.

The control flow graph of FIG. 4 contains 2 decision nodes, P1 and P4, and as a result FIGS. 5a, 5b, 5c and 5d show 4 sub-graphs which represent each possible computational path through the program defined by the control flow graph. The sub-graph of FIG. 5a represents the path for a hint of test1=true and test2=true, the sub-graph of FIG. 5b represents the path for a hint of test1=true and test2=false, the sub-graph of FIG. 5c represents the path for a hint of test1=false and test2=true, and the sub-graph of FIG. 5d represents the path for a hint of test1=false and test2=false.

Accordingly, for the purposes of reach-ability analysis, there are four candidate hints each of which define a particular computational path through the program 300 of FIG. 3, and these hints are shown in FIG. 6a. The figure shows the settings for each decision variable and the program path which they would exercise. Note that in the figure the program paths are expressed by the statement nodes which represent the code in the program path, For example S2+S5 denotes the program path which include these statements.

However, the order in which the hints are applied may affect the number of states which are reached during program analysis. For example consider that each of the variables a, b, c and d of program 300 of FIG. 3 are 2 bit values and are therefore restricted to the values 0, 1, 2 and 3. Further assume that for the purposes of reachability analysis each has an initial state of 0. This initial state may be written (0,0,0,0) the first value corresponding to the value of a, the second value corresponding to the value of b, etc.

During reachability analysis each hint is applied in turn. When a hint is applied each known state is used as an initial state, and for each initial state the path through the code defined by the hint is repeatedly executed to reach new states. When no additional states for a given initial state are possible the next known state is used as an initial state and when all known states have been used and no additional states are possible the next hint is applied and the process repeated. For a given hint the known states are the initial state and the new states found by previously applied hints.

Accordingly based on these assumptions the states achieved during program analysis, of program 300 of FIG. 3, for a given order of hints is shown in the table of FIG. 6b. The first row of the table shows the initial state (0,0,0,0) and the second row shows the nodes S2+S6 which are exercised by application of the first hint (i.e.: test1=true and test2=true). However the code associated with these two nodes do not change the values of any variables and as a result no new states are reached. The third row of the table shows the nodes S2+S6 which are exercised by application of the second hint (i.e.: test1=true and test2=false), and during a first run through variable c is incremented by the statement (c=c+1) associated with S2 and as a result a new state (0,0,1,0) is reached. Each subsequent execution sets b to the current value of c (S2) and increments c (S3) thus reaching the new states (0,1,2,0) and (0,2,3,0). After this no more new states are found for this hint because C has reached its maximum value and there are no further known states to use as an initial state. The fourth and fifth row then show the new states reached by applying the remaining hints to each of the known states as initial states. For example the first new state (2,0,1,1) is found by exercising nodes S2+S6 based on the third hint (i.e.: test1=false and test2=true) using an initial state of (0,0,1,0) which is a known state based on application of the previous hint. Accordingly FIG. 6b shows all of the states reached by applying the hints in a given order and this shows that 9 new states are reached.

However, applying the hints in a different order may result in more states being reached and as a result the present invention discloses a method for finding an order for hints which ensures that the number of states reached is more than that of some other orders. That is the method does not ensure that the hints are applied in an order which maximizes the states reached, although it does not exclude this possibility, but rather provides an intelligent ordering of the hints to provide a reasonable coverage of states. This is useful, for example, when automating the process of ordering of hints to ensure that the order selected is not the worst or one of the worst available.

Figure 7:
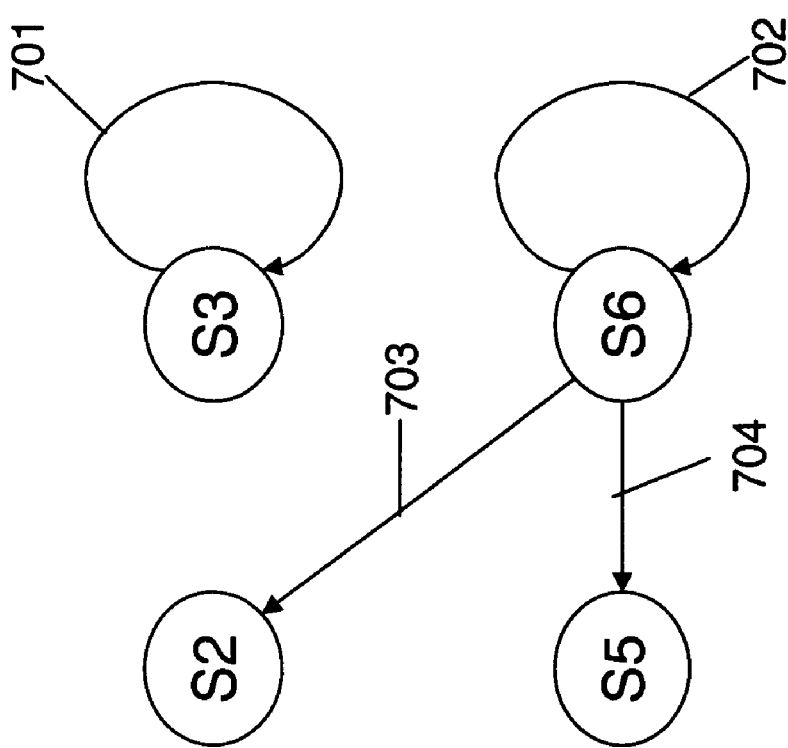
FIG. 7 is a representation of a Program Dependency Graph (PDG) for the sample program of FIG. 3.

The first stage in the process is to generate a Program Dependency Graph (PDG) and FIG. 7 shows the Program Dependency Graph of the program 300 of FIG. 3. The figure shows the statement nodes of the control flow graph of FIG. 4, but with the arcs replaced with data dependency links. In this graph a link from a first node to a second node shows that the second node uses a variable for which the value is set in the first node. Accordingly, for example, there is a data dependency link 702 from S6 to S2 based on variable c being set in S6 and used in S2.

Figure 8:
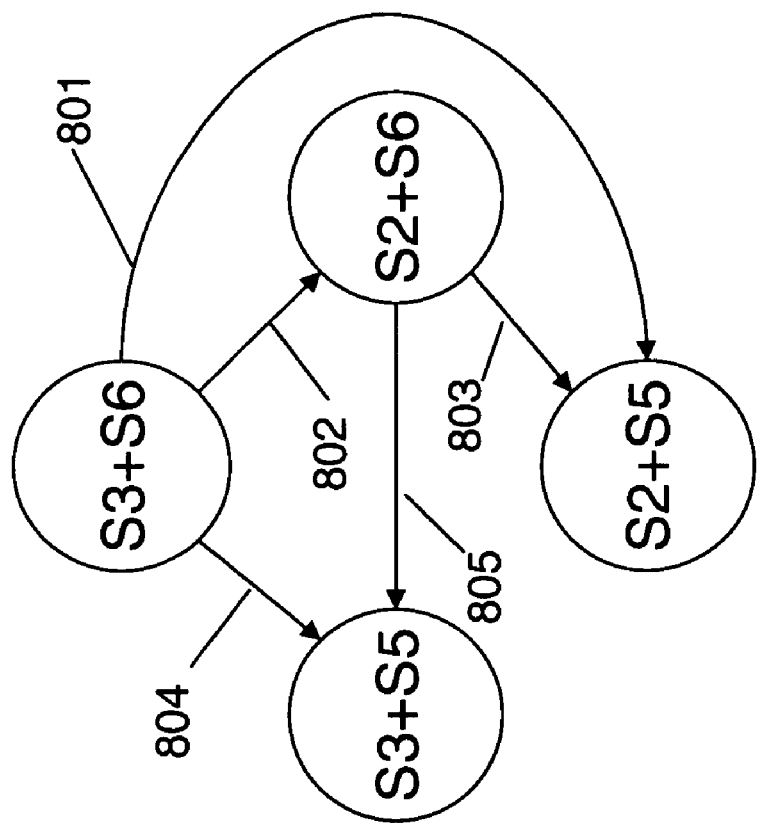
FIG. 8 is a Subprogram Dependency Graph (SDG) for the sample program of FIG. 3.

The next stage in the process is to draw a Sub-Program Dependency Graph (SDG) and the SDG for the program 300 of FIG. 3 is shown in FIG. 8. The SDG has a node for each of the sub-graphs (FIGS. 5a, 5b, 5c and 5d) of the control flow graph (FIG. 4). Accordingly there is, for example, a node labeled S3+S6 which represents the sub-graph shown in FIG. 5d which is the sub-graph which includes these two nodes. Further the nodes are joined by arcs which are based on the arcs of the Program Dependency Graph of FIG. 7. For example the dependency of S2 on S6, shown by arc 703 in FIG. 7, is represented in FIG. 8 by arcs 801 and 802 which are arcs which go from a node which contains S6 to a node which contains S2. Similarly the arcs 803, 804 and 805 represent the dependency of S5 on S6 which is shown by arc 704 in FIG. 7. Accordingly the nodes which are joined by arcs are termed Strongly Connected Components and are used to determine a pre-order for the hints. In particular the SDG of FIG. 8 shows 5 pre-orders, S3+S6 is earlier in the order than each of the other three nodes, and S2+S6 is earlier in the pre-order than S3+S5 and S2+S5.

Figure 9:
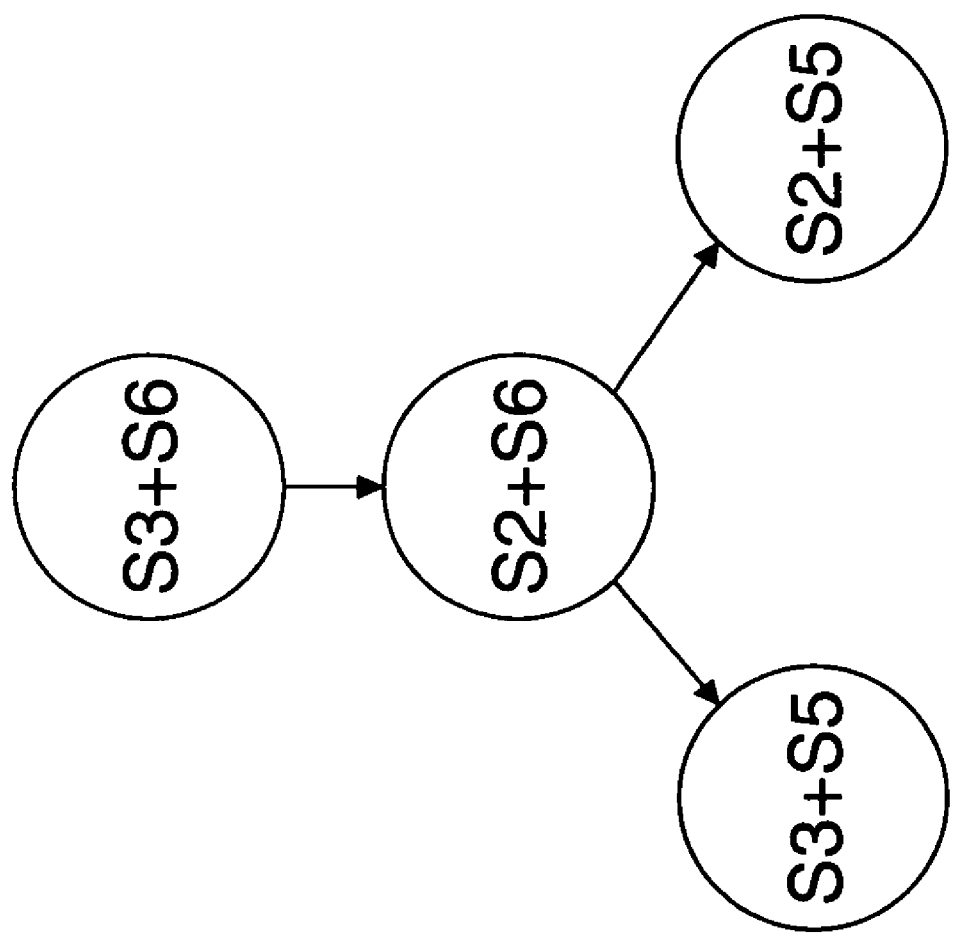
FIG. 9 is a version of a Strongly Connected Component (SCC) quotient graph for the sample program of FIG. 3.

From these pre-orders a Strongly Connected Component (SCC) quotient graph may be determined which is a linearized version of the SDG. However, FIG. 9 shows an SCC quotient graph, which is not fully linearized for the purpose of illustration. This is because the determined pre-order does not determine an order to run the hints for S3 and S5 and S2 and S5, and for the purposes of this example the order in which these will be applied are arbitrarily decided as the main part of the ordering which will achieve a reasonable coverage of states has been determined.

Accordingly FIGS. 10a and 10b are tables of the states which may be reached by applying the hints in either of the orders which the SCC quotient graph of FIG. 9 defines. These states are determined by the process described with reference to table of FIG. 6b. From these tables it can be seen that either order would result in 16 states being reached compared to the 9 states of the order used to generate the table of FIG. 6b. Accordingly an order to apply the hints which reaches a reasonable number of states has been determined based on a defined process.

Note that in the example used to demonstrate the preferred embodiment of the present invention the pre-order does not determine an order to run the hints for S3 and S5 and S2 and S5 because there is no basis on which to decide. However, by way of example and referring to FIG. 8, if node S3+S6 had a dependency on S3+S5, arc 804 would be a two way arc. In this case the S3+S5 node would have a tighter interaction with the start node S3+S6 compared to the S2+S5 node. As a result the hint for S3+S5 would be placed higher in the pre-order than the hint for S2+S5. In general the tightness of an interaction between two nodes is determined by the length of the paths from one node to the other and vice-versa.

FIG. 11 is a flow diagram of the method steps of the preferred embodiment of the present invention for determining an order to apply hints for performing reach-ability analysis of a program. At step 1101 the data dependencies between each program path defined by a hint are determined, and at step 1102 the hints are prioritized based on the determined data dependencies. For example, in step 1102 a first hint is prioritized over a second hint if the program path defined by the first hint sets a variable which is used in the program path defined by the second hint. A total order is then determined which best fits the determined priorities. However, it may be that step 1102 leaves some hints which are of equal priority and these are prioritized at step 1103. For example, in step 1103 a third hint is prioritized over a fourth hint if the program path defined by the third hint has a tighter interaction with a designated program path than the program path defined by the fourth hint. For example the designated program path can be that defined by the hint which is considered to be of top priority in step 1102. If two hints are still of equal priority the order of these is arbitrarily determined and the output of step 1102 is a total order of the hints. Finally at step reach-ability analysis of the program is performed by applying the hints in the determined total order.

An expression of the steps of methods in accordance with the preferred embodiment may be characterized as:

Parse input source and create CFG;
Perform control and data dependence analysis on CFG;
Generate PDG;
Eliminate infeasible data dependency paths from PDG using abstract interpretation (integer interval abstract domain) if model checking of subprogram reachability property timeouts;
Extract data dependency SCCs from the PDG—if intractable, reduce every instance of a variable to a single instance and repeat once;
If previous step was successful, perform input data analysis on SCCs using abstract interpretation (simple abstract domain) or else quit.
Perform abstract interpretation (integer interval abstract domain) on all subprograms consisting only the variables contained in a SCCs;
Eliminate SCCs whose abstract interpretation results are contained in an input data dependent SCC abstract interpretation result, but add its decision predicates to the input data dependent abstract interpretation SCC decision set; and
Generate hints from remaining SCCs using the decision sets of each SCC following the partial ordering on the subprogram SCCs.

During the determination of hints, a goal is to retrieve pertinent information (valid paths, over-approximate reachable states, etc.) from the original program text by utilizing the smallest subset of the original program text during the analysis while achieving the same results. Program slicing allows efficient and effective achievement of this goal. Program slicing is a technique used during static program analysis to identify all statements that might affect the value of a given variable occurrence. The statements selected constitute a subprogram with respect to the variable occurrence. For a statement $S_i$ in a PDG, the static program slice with respect to $S_i$ is the set of statements $S_1, S_2, S_3 \ldots$ in the PDG that can reach $S_i$ via a path of flow or control dependence edges. The program slice for a set of statements S is simply the union of each statement $S_i$ program slice. Moreover, a program slice exhibits the same behavior as the original program for the variables of interest for the same input data. Program slicing or parsing is employed during infeasible path analysis and valid computational paths to minimize the size of the original source used to verify these properties; such as, "whether or not there exists a path such that the value assigned to $S_1$ at location x is used by $S_2$ at location y?".

The naive approach to determining the computational paths in a program is to generate all possible paths in the programs CFG. This would result in up to $2^n$ computational paths, where n is the number of directed acyclic paths in the CFG or the number of decisions in the program text. Here, the set of computational paths is limited to the paths that arise from the cyclic dependency relationship between the program variables and the partitioning of the original program over its input space. These paths represent the possible fix point computations that are active during reachability analysis. By determining these paths early the inter-computational interactions that cause the intermediate BDD explosion can be prevented. Conceptually a program may be thought of as a collection of subprograms, each computing values for some or all the program variables. Several subprograms may compute values of the same variable and overlap one another. The more complex the control structure or number of decisions, the more complex the intermingling of the sub programs. Static program slicing isolates all possible subprograms computing a particular variable and its control and data dependencies.

For a program P and its associated CFG, there exists for each path in the computation tree a corresponding path in the CFG. Many paths in the computation tree may map to the same path in the CFG and that there may exist paths in the CFG that do not correspond to computation tree paths. For example, consider a boolean predicate that, because of previous computation, always evaluates to the constant true. The computation tree would have no paths where this predicate evaluates false, but the CFG may represent both possible conditional edges emanating from the node representing the conditional predicate. Thus, the CFG approximates the computation tree by representing additional behaviors, which do not correspond to any program execution. Such spurious executions are called infeasible paths. It can be said that the CFG overestimates program behavior. In previous discussion, the naive approach to defining a program slice would entail finding all nodes whose execution could possible affect the value of a variable at some node. This over approximation introduces infeasible paths in the subprogram produced by the program slice.

Isolating the source of the fix points in a program (subprogram) is key to keeping the intermediate BDDs small. The set of program variables are not all interdependent and an ordering among the equivalence classes of the variables may be obtained by partitioning the variables. Restricting fix point computations (reachability analysis) to each partition and arranging these computations to follow the implied partial ordering will yield greater efficiency than the naive approach. More specifically, for any PDG and its associated data dependency graph, it is possible to easily extract the strongly connected components (SCCs) graph [elementaryCircuits]. The SCC graphs can be collapsed into a single node resulting in a topological sort of the partial ordering formed by these nodes. This order is used to determine the order of the final hints produced.

The input data dependency analysis performed on the final set of computational paths with cyclic dependencies is to determine whether the variables included in a SCC are input dependent. A input dependent SCC will saturate faster and produce smaller BDDs. This method favors input dependent SCCs over non-input dependent SCCs for the same variable IDs.

The technique here described has been implemented on a 400 MHz Pentium IV machine with 500 MB of RAM running Linux. The results are reported in the Table that follows.

| Circuit | Ffs | Reachable states | Times BFS | in Manual Hints | seconds Invention technique |
|---|---|---|---|---|---|
| CRC | 32 | 4.295e+09 | Memory out | 0.17 | 0.17 |
| BPB | 36 | 6.872e+10 | 193.79 | 1.04 | 52.77 |
| Rotator | 64 | 1.845e+19 | Memory out | 0.17 | 0.17 |
| Vsa | 66 | 1.625e+14 | 6974.7 | 111.8 | 175.34 |

Four circuits having Verilog source files and which did not require intertask support were used in the implementations. CRC computes a 32-bit cyclic redundancy code of a stream of bytes. BPB is a branch prediction buffer that predicts whether a branch should be taken depending on the correctness of the previous predictions. Rotator is a barrel shifter sandwiched between registers. Vsa is a very simple non-pipelined microprocessor that executes 12-bit instructions—ALU operations, loads, stores, conditional branch—in five stages: fetch, decode, execute, memory access, and write-back. It has four registers, with one always set to zero.

The table shows the comparison of reachability analysis with hints generated by the inventive technique against BFS runs and manual hints. Columns 1, 2, and 3 give the name of the circuit, number of flip-flops (state variables) and number of reachable states of the circuit. Columns 4, 5 and 6 compare run times for reachability analysis for BFS, manual hints, and hints obtained using the technique of this invention, respectively. The circuits in this table are mid-sized, but two of these circuits—CRC and Rotator—run out of memory for BFS. The inventive and manual hints were able to provide dramatic improvements to the traversal of these circuits, enabling completion times of a few seconds. With the remaining circuits in BPB and Vsa demonstrate 1-2 orders of magnitude improvement.

In this disclosure it has been shown that state traversal guided by algorithm generated hints can substantially speed up reachability analysis. Orders-of-magnitude improvement have been obtained is several cases, and visible gains have been achieved in most experiments that have been run. The hints prescribe constraints for the input and state variables of the system. Deriving the hints requires some knowledge of the circuit organization and behavior, at the level a verification engineer needs to devise simulation stimuli or properties to be checked. Simple heuristics often allow one to find hints that are effective for both properties that fail and properties that pass.

In the drawings and specifications there has been set forth a preferred embodiment of the invention and, although specific terms are used, the description thus given uses terminology in a generic and descriptive sense only and not for purposes of limitation.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

What is claimed is:

1. A method, executed by at least one processor, comprising:
    obtaining a set of hints for use in performing reachability analysis of a program, each hint defining a particular computational path of the program;
    determining an order to apply the hints to determine a plurality of first and second hints when performing the reachability analysis comprising:
        determining that a variable which is set in the program path defined by the first hint is used in a program path defined by the second hint; and
        prioritizing the first hint over the second hint; and
    checking a validity of a determination that a variable which is set in the program path defined by one of the hints is used in a program path defined by another of the hints, wherein the variable is set in a first statement and used in a second statement, comprising:
        associating a setting of a token variable to a first predetermined value with the first statement;

associating with any statements between the first and second statements which modify the value of the variable, the setting of the token variable to a second predetermined value; and determining that the data dependency does not exist if the second statement is not reachable with the token variable set to the first predetermined value.

2. The method of claim 1 wherein determining a order to apply the hints further comprises:

determining that a variable which is set in the program path defined by the second hint is used in a program path defined by a third hint; and prioritizing the second hint ahead of the third hint.

3. The method of claim 1, wherein the determined plurality of the first and second hints have an equal priority, wherein determining the order to apply the hints further comprises:

prioritizing the determined plurality hints based on the interaction of the program paths which each hint defines with a designated program path.

4. The method of claim 1 wherein the step of checking the validity of the determination that the variable which is set in the program path defined by one of the hints is used in a program path defined by another of the hints further comprises:

setting a second token to the second predetermined value; and associating with the second statement, the setting of the second token to the value of the first token; and wherein determining that the data dependency does not exist comprises using the second token to obtain the value of the first token when the subsequent statement is reached.

5. A data processing system comprising:

at least one processor; and memory accessible to the at least one processor and comprising a file system;

the at least one processor for performing sub-processes of:

obtaining a set of hints for use in performing reachability analysis of a program, each hint defining a particular computational path of the program;

determining an order to apply the hints to determine a plurality of first and second hints when performing the reachability analysis comprising:

determining that a variable which is set in the program path defined by the first hint is used in a program path defined by the second hint; and prioritizing the first hint over the second hint; and checking a validity of a determination that a variable which is set in the program path defined by one of the hints is used in a program path defined by another of the hints, wherein the variable is set in a first statement and used in a second statement, comprising:

associating a setting of a token variable to a first predetermined value with the first statement;

associating with any statements between the first and second statements which modify the value of the variable, the setting of the token variable to a second predetermined value; and determining that the data dependency does not exist if the second statement is not reachable with the token variable set to the first predetermined value.

6. The data processing system of claim 5 wherein the sub-process of determining an order to apply the hints further comprises:

determining that a variable which is set in the program path defined by the second hint is used in a program path defined by a third hint; and prioritizing the second hint ahead of the third hint.

7. The data processing system of claim 5, wherein the determined plurality of the first and second hints have an equal priority, wherein the sub-process of determining an order to apply the hints further comprises:

prioritizing the determined plurality hints based on the interaction of the program paths which each hint defines with a designated program path.

8. The data processing system of claim 5 wherein the sub-process of checking the validity of the determination that the variable which is set in the program path defined by one of the hints is used in a program path defined by another of the hints further comprises:

setting a second token to the second predetermined value; and associating with the second statement, the setting of the second token to the value of the first token; and wherein determining that the data dependency does not exist comprises using the second token to obtain the value of the first token when the subsequent statement is reached.

9. A computer program product comprising a computer readable medium having a computer readable program, wherein the computer readable program when executed on a computer causes the computer to perform operations comprising:

obtaining a set of hints for use in performing reachability analysis of a program, each hint defining a particular computational path of the program;

determining an order to apply the hints to determine a plurality of first and second hints when performing the reachability analysis comprising:

determining that a variable which is set in the program path defined by a first hint is used in a program path defined by a second hint; and prioritizing the first hint over the second hint; and checking the validity of a determination that a variable which is set in the program path defined by a one of the hints is used in a program path defined by another of the hints, wherein the variable is set in a first statement and used in a second statement, comprising:

associating the setting of a token variable to a first predetermined value with the first statement;

associating with any statements between the first and second statements which modify the value of the variable, the setting of the token variable to a second predetermined value; and determining that the data dependency does not exist if the second statement is not reachable with the token variable set to the first predetermined value.

10. The computer program product of claim 9 wherein determining a order to apply the hints further comprises:

determining that a variable which is set in the program path defined by the second hint is used in a program path defined by a third hint; and prioritizing the second hint ahead of the third hint.

11. The computer program product of claim 9, wherein the determined plurality of the first and second hints have an equal priority, wherein determining an order to apply the hints further comprises:

prioritizing the determined plurality hints based on the interaction of the program paths which each hint defines with a designated program path.

12. The computer program product of claim 9 wherein the step of checking the validity of the determination that the variable which is set in the program path defined by a one of the hints is used in a program path defined by another of the hints further comprises:

setting a second token to the second predetermined value; and associating with the second statement, the setting of the second token to the value of the first token; and wherein determining that the data dependency does not exist comprises using the second token to obtain the value of the first token when the subsequent statement is reached.

* * * * *